(12) United States Patent
Kono et al.

(10) Patent No.: US 11,094,786 B2
(45) Date of Patent: Aug. 17, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hiroshi Kono, Himeji Hyogo (JP); Souzou Kanie, Himeji Hyogo (JP); Shigeto Fukatsu, Himeji Hyoto (JP); Takuma Suzuki, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/808,696

(22) Filed: Mar. 4, 2020

(65) Prior Publication Data

US 2021/0091186 A1 Mar. 25, 2021

(30) Foreign Application Priority Data

Sep. 20, 2019 (JP) .............................. JP2019-171104

(51) Int. Cl.
*H01L 29/16* (2006.01)
*H01L 29/78* (2006.01)
(Continued)

(52) U.S. Cl.
CPC ...... *H01L 29/1608* (2013.01); *H01L 29/0603* (2013.01); *H01L 29/0696* (2013.01); *H01L 29/1095* (2013.01); *H01L 29/7802* (2013.01)

(58) Field of Classification Search
CPC . H01L 29/06; H01L 29/0603; H01L 29/0619; H01L 29/0692; H01L 29/0696;
(Continued)

(56) References Cited

U.S. PATENT DOCUMENTS

2008/0169526 A1* 7/2008 Wakimoto .......... H01L 29/7813
257/490
2012/0205666 A1* 8/2012 Henning ............. H01L 29/0619
257/77
(Continued)

FOREIGN PATENT DOCUMENTS

JP 2007-227620 A 9/2007
JP 2015-8281 A 1/2015
(Continued)

*Primary Examiner* — Fazli Erdem
(74) *Attorney, Agent, or Firm* — White & Case LLP

(57) ABSTRACT

A semiconductor device of embodiments includes a silicon carbide layer including an element region and a termination region around the element region, the termination region having first straight-line portions extending in a first direction, second straight-line portions extending in a second direction, and corner portions between the first straight-line portions and the second straight-line portions, the termination region including a second-conductivity-type second silicon carbide region having a dot-line shape with first dot portions and first space portions surrounding the element region, an occupation ratio of the first dot portions is larger in the corner portions than in the first straight-line portions, and a second-conductivity-type third silicon carbide region having a dot-line shape with second dot portions and second space portions surrounding the second silicon carbide region, an occupation ratio of the second dot portions is lager in the corner portions than in the first straight-line portions.

18 Claims, 6 Drawing Sheets

(51) Int. Cl.
*H01L 29/06* (2006.01)
*H01L 29/10* (2006.01)

(58) Field of Classification Search
CPC . H01L 29/16; H01L 29/1608; H01L 29/1095; H01L 29/78; H01L 29/7802; H01L 29/7811; H01L 29/872
USPC .......................................................... 257/77
See application file for complete search history.

(56) References Cited

U.S. PATENT DOCUMENTS

| | | | |
|---|---|---|---|
| 2015/0357405 A1* | 12/2015 | Ueda ..................... | H01L 29/872 257/77 |
| 2016/0087031 A1 | 3/2016 | Ebihara et al. | |
| 2016/0372540 A1* | 12/2016 | Kitamura .............. | H01L 29/872 |
| 2019/0288074 A1 | 9/2019 | Takeuchi et al. | |
| 2019/0386096 A1* | 12/2019 | Takeuchi ............ | H01L 29/6606 |
| 2020/0266268 A1* | 8/2020 | Uchida ............... | H01L 23/3192 |

FOREIGN PATENT DOCUMENTS

| | | |
|---|---|---|
| JP | 6-244405 A | 12/2017 |
| JP | 2018-006629 A | 1/2018 |
| JP | 2018-098324 A | 6/2018 |

* cited by examiner

SEMICONDUCTOR DEVICE

CROSS-REFERENCE TO RELATED APPLICATION

This application is based upon and claims the benefit of priority from Japanese Patent Application No. 2019-171104, filed on Sep. 20, 2019, the entire contents of which are incorporated herein by reference.

FIELD

Embodiments described herein relate generally to a semiconductor device.

BACKGROUND

It is known that movement of external charges or injected charges to an oxide film on the semiconductor layer during the operation of the semiconductor device cause a variation in characteristics of the semiconductor device. The variation in characteristics leads to degradation of device reliability. For example, the external charges and the injection charges are trapped in the oxide film of the termination region of the semiconductor device. If the external charges or the injected charges are trapped into the oxide film of the termination region, the electric field distribution in the termination region is changed, which causes a variation in breakdown voltage of the semiconductor device.

DETAILED DESCRIPTION

Figure 1:
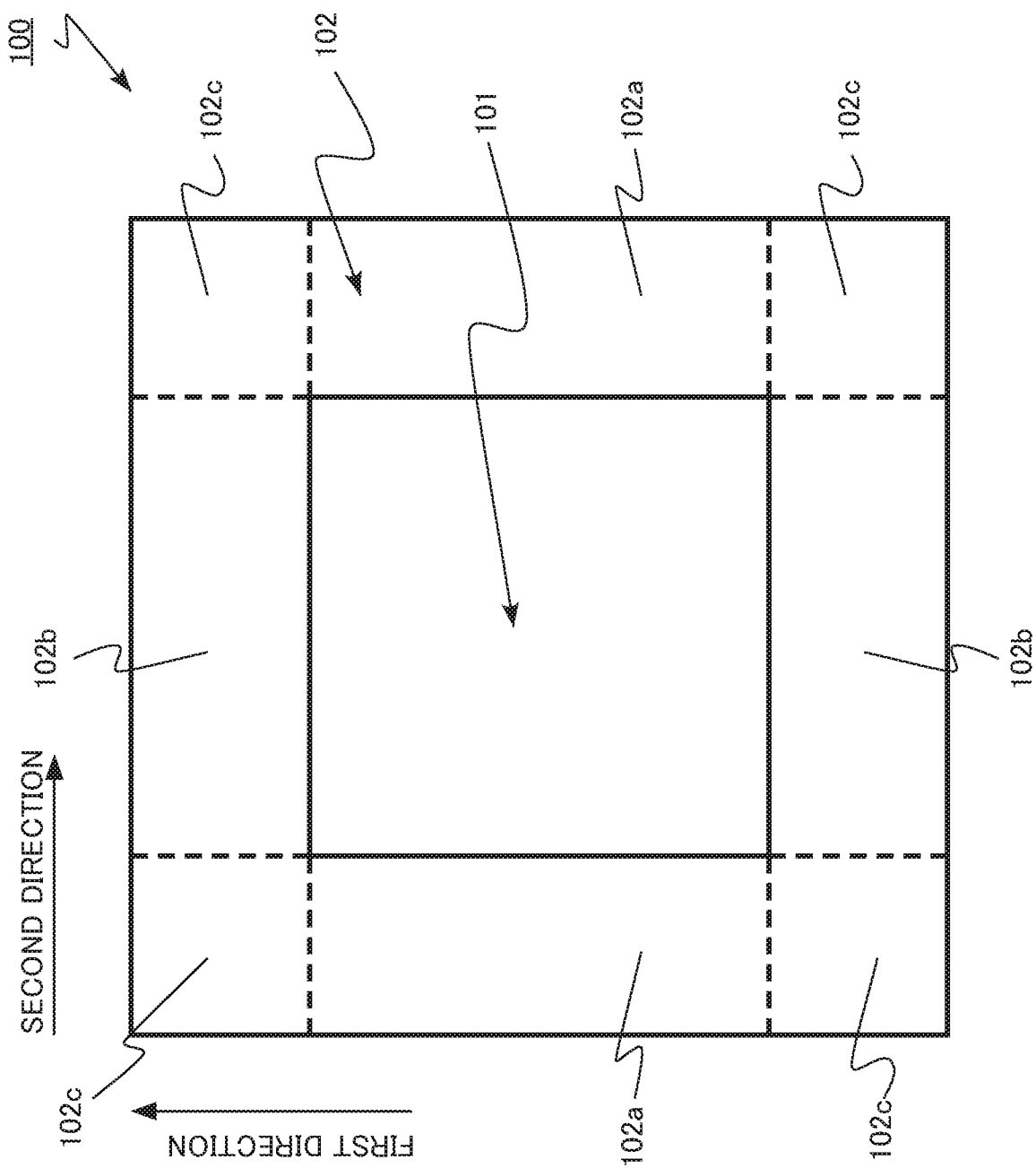
FIG. 1 is a schematic top view of a semiconductor device according a first embodiment.

A semiconductor device of an embodiment includes: a silicon carbide layer having a first plane and a second plane, the silicon carbide layer including an element region and a termination region surrounding the element region, the termination region having first straight-line portions extending in a first direction, second straight-line portions extending in a second direction intersecting the first direction, and corner portions between the first straight-line portions and the second straight-line portions, the termination region including a first silicon carbide region of first-conductivity-type, a second silicon carbide region of second-conductivity-type provided between the first silicon carbide region and the first plane, the second silicon carbide region surrounding the element region, the second silicon carbide region having a dot-line shape configured with first dot portions and first space portions between the first dot portions, an occupation ratio of the first dot portions of the corner portions being larger than an occupation ratio of the first dot portions of the first straight-line portions, a third silicon carbide region of second-conductivity-type provided between the first silicon carbide region and the first plane, the third silicon carbide region surrounding the second silicon carbide region, the third silicon carbide region having a dot-line shape configured with second dot portions and second space portions between the second dot portions, an occupation ratio of the second dot portions of the corner portions being larger than an occupation ratio of the second dot portions of the first straight-line portions, and a fourth silicon carbide region of second-conductivity-type provided between the first silicon carbide region and the first plane, the fourth silicon carbide region surrounding the third silicon carbide region, the fourth silicon carbide region having a dot-line shape configured with third dot portions and third space portions between the third dot portions, an occupation ratio of the third dot portions of the corner portions being larger than an occupation ratio of the third dot portions of the first straight-line portions; a first electrode provided on a side of the first plane of the silicon carbide layer; and a second electrode provided on a side of the second plane of the silicon carbide layer.

Hereinafter, embodiments will be described with reference to accompanying drawings. In the following description, in some cases, the same or similar members are denoted by the same reference numerals, and the description of the members or the like that have been described once is omitted as appropriate.

In addition, in the following description, the notations $n^+$, n, $n^-$ and $p^+$, p, $p^-$, $p^{--}$ represent the relative levels of the impurity concentrations in the respective conductivity types. That is, $n^+$ represents to be relatively higher in the n-type impurity concentration than n, and $n^-$ represents to be relatively lower in the n-type impurity concentration than n. In addition, $p^+$ represents to be relatively higher in the p-type impurity concentration than p, $p^-$ represents to be relatively lower in the p-type impurity concentration than p, and $p^{--}$ represents to be relatively lower in the p-type impurity concentration than $p^-$. In addition, in some cases, the $n^+$-type and the $n^-$-type may be simply referred to as the n-type and the $p^+$-type, $p^-$-type, and the $p^{--}$-type may be simply referred to as the p-type.

In addition, in this specification, unless otherwise stated, the term "impurity concentration" is intended to denote a concentration obtained by compensating for the concentration of impurities of opposite conductivity type. In other words, an n-type impurity concentration of the silicon carbide region of the n-type denotes a concentration obtained by subtracting the p-type impurity concentration from the n-type impurity concentration. In addition, a p-type impurity concentration of the silicon carbide region of the p-type denotes a concentration obtained by subtracting the n-type impurity concentration from the p-type impurity concentration.

The impurity concentration can be measured by, for example, time of flight-secondary ion mass spectrometry (TOF-SIMS). In addition, the relative level of the impurity concentration may also be determined from the level of the carrier concentration obtained by, for example, scanning capacitance microscopy (SCM). In addition, the distance such as the depth and thickness of the impurity region can be determined by, for example, the TOF-SIMS. In addition, the distance such as the depth the thickness, the width, and the spacing of the impurity region can be determined from, for example, a composite image of an SCM image and an atomic force microscope (AFM) image.

First Embodiment

A semiconductor device of a first embodiment includes: a silicon carbide layer having a first plane and a second plane, the silicon carbide layer including an element region and a termination region surrounding the element region, the termination region having first straight-line portions extending in a first direction, second straight-line portions extending in a second direction intersecting the first direction, and corner portions between the first straight-line portions and the second straight-line portions, the termination region including a first silicon carbide region of first-conductivity-type, a second silicon carbide region of second-conductivity-type provided between the first silicon carbide region and the first plane, the second silicon carbide region surrounding the element region, the second silicon carbide region having a dot-line shape configured with first dot portions and first space portions between the first dot portions, an occupation ratio of the first dot portions of the corner portions being larger than an occupation ratio of the first dot portions of the first straight-line portions, a third silicon carbide region of second-conductivity-type provided between the first silicon carbide region and the first plane, the third silicon carbide region surrounding the second silicon carbide region, the third silicon carbide region having a dot-line shape configured with second dot portions and second space portions between the second dot portions, an occupation ratio of the second dot portions of the corner portions being larger than an occupation ratio of the second dot portions of the first straight-line portions, and a fourth silicon carbide region of second-conductivity-type provided between the first silicon carbide region and the first plane, the fourth silicon carbide region surrounding the third silicon carbide region, the fourth silicon carbide region having a dot-line shape configured with third dot portions and third space portions between the third dot portions, an occupation ratio of the third dot portions of the corner portions being larger than an occupation ratio of the third dot portions of the first straight-line portions; a first electrode provided on a side of the first plane of the silicon carbide layer; and a second electrode provided on a side of the second plane of the silicon carbide layer.

Figure 2:
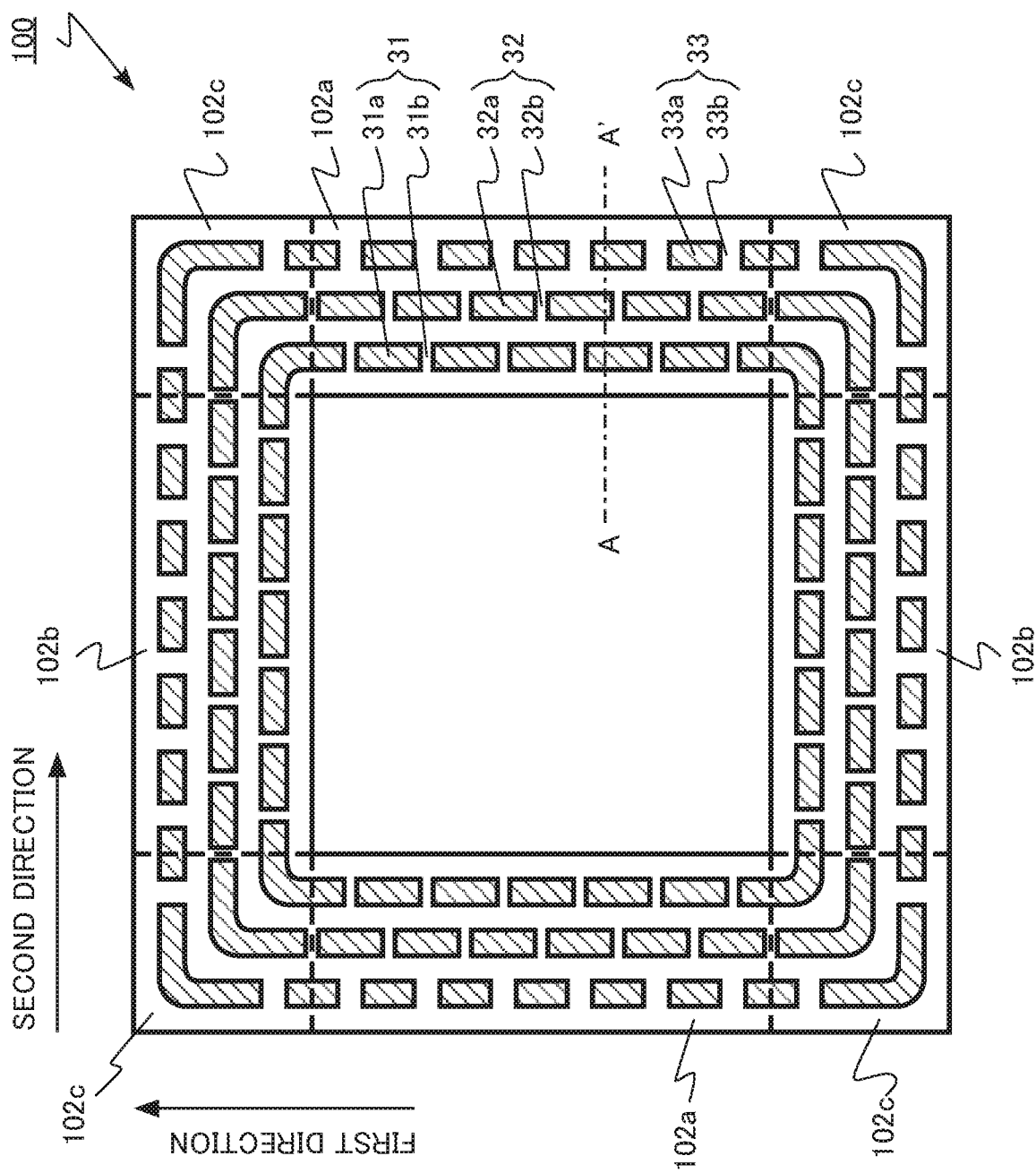
FIG. 2 is a schematic top view of the semiconductor device of the first embodiment.
Figure 3:
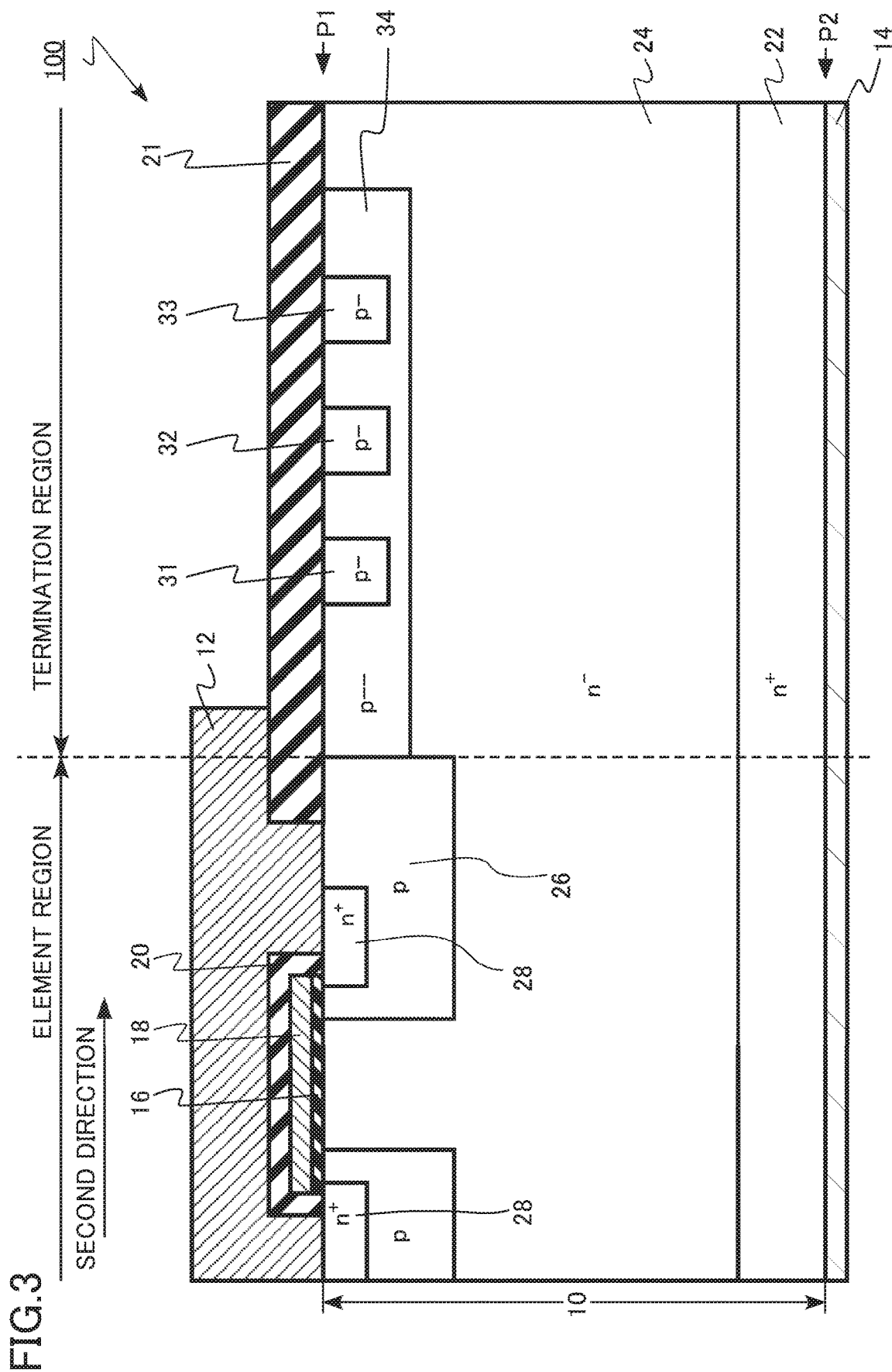
FIG. 3 is a schematic cross-sectional view of the semiconductor device of the first embodiment.

FIG. 1 is a schematic top view of the semiconductor device of the first embodiment. FIG. 2 is a schematic top view of the semiconductor device of the first embodiment. FIG. 3 is a schematic cross-sectional view of the semiconductor device of the first embodiment. FIG. 3 is a cross-sectional view taken along line A-A' of FIG. 2.

The semiconductor device of the first embodiment is a vertical planar gate type MOSFET 100 using silicon carbide. The MOSFET 100 of the first embodiment is, for example, a double implantation MOSFET (DIMOSFET) in which a body region and a source region are formed by ion implantation.

The MOSFET 100 includes an element region 101 and a termination region 102 surrounding the element region 101. The element region 101 functions as a region in which current mainly flows in the state where the MOSFET 100 is turned on. The termination region 102 functions as a region to improve the breakdown voltage of the MOSFET 100 by relaxing the strength of the electric field applied to the end portion of the element region 101 in the state where the MOSFET 100 is turned off.

The termination region 102 has first straight-line portions 102*a* extending in a first direction, second straight-line portions 102*b* extending in a second direction intersecting the first direction, and corner portions 102*c* between the first straight-line portions 102*a* and the second straight-line portions 102*b*. The angle between the first direction and the second direction is, for example, 80 degrees or more and 100 degrees or less. The first direction and the second direction are, for example, perpendicular to each other.

Hereinafter, a case where the first conductivity type is an n-type and the second conductivity type is a p-type will be described as an example. The MOSFET 100 is a vertical n-channel type MOSFET using electrons as carriers.

The MOSFET 100 includes a silicon carbide layer 10, a source electrode 12 (first electrode), a drain electrode 14 (second electrode), a gate insulating layer 16, a gate electrode 18, an interlayer insulating layer 20, and a field insulating layer 21.

The silicon carbide layer 10 includes an $n^+$-type drain region 22, an $n^-$-type drift region 24 (first silicon carbide region), a p-type body region 26, an $n^+$-type source region 28, a $p^-$-type first guard ring region 31 (second silicon carbide region), a $p^-$-type second guard ring region 32 (third silicon carbide region), a $p^-$-type third guard ring region 33 (fourth silicon carbide region) and a $p^{--}$-type resurf region 34 (fifth silicon carbide region).

The silicon carbide layer 10 is provided between the source electrode 12 and the drain electrode 14. The silicon carbide layer 10 is made of a single crystal SiC. The silicon carbide layer 10 is made of, for example, a 4H-SiC.

The silicon carbide layer 10 has a first plane ("P1" in FIG. 3) and a second plane ("P2" in FIG. 3). Hereinafter, in some cases, the first plane is referred to as a front plane, and the second plane is referred to as a back plane. The first plane P1 is located on the source electrode 12 side of the silicon carbide layer 10. In addition, the second plane P2 are located on the drain electrode 14 side of the silicon carbide layer 10. In addition, hereinafter, the term "depth" denotes a depth in the direction from the first plane as a reference toward the second plane.

The first plane P1 is, for example, a plane inclined by 0 degrees or more and 8 degrees or less with respect to (0001) plane. In addition, the second plane P2 is, for example, a plane inclined by 0 degrees or more and 8 degrees or less with respect to (000-1) plane. The (0001) plane is referred to as a silicon face. The (000-1) plane is referred to as a carbon face.

The $n^+$-type drain region 22 is provided on the back plane side of the silicon carbide layer 10. The drain region 22 contains, for example, nitrogen (N) as an n-type impurity. The n-type impurity concentration of the drain region 22 is, for example, $1\times10^{18}$ cm$^{-3}$ or more and $1\times10^{21}$ cm$^{-3}$ or less.

The $n^-$-type drift region 24 is provided between the drain region 22 and the first plane P1. The $n^-$-type drift region 24 is provided between the source electrode 12 and the drain electrode 14. The $n^-$-type drift region 24 is provided between the gate electrode 18 and the drain electrode 14.

The $n^-$-type drift region 24 is provided on the drain region 22. The drift region 24 contains, for example, nitrogen (N) as an n-type impurity. The n-type impurity concentration of the drift region 24 is lower than the n-type impurity concentration of the drain region 22. The n-type impurity concentration of the drift region 24 is, for example, $4\times10^{14}$ cm$^{-3}$ or more and $1\times10^{19}$ cm$^{-3}$ or less. The thickness of the drift region 24 is, for example, 5 μm or more and 150 μm or less.

The p-type body region 26 is provided between the drift region 24 and the first plane P1. The body region 26 functions as a channel region of the MOSFET 100.

The body region 26 contains, for example, aluminum (Al) as a p-type impurity. The p-type impurity concentration of the body region 26 is, for example, $5\times10^{17}$ cm$^{-3}$ or more and $5\times10^{19}$ cm$^{-3}$ or less.

The depth of the body region 26 is, for example, 0.5 µm or more and 1.0 µm or less.

The body region 26 is in contact with the source electrode 12. The body region 26 is fixed to the potential of the source electrode 12.

The n$^+$-type source region 28 is provided between the body region 26 and the first plane P1. The source region 28 contains, for example, phosphorus (P) as an n-type impurity. The n-type impurity concentration of the source region 28 is higher than the n-type impurity concentration of the drift region 24.

The n-type impurity concentration of the source region 28 is, for example, $1\times10^{19}$ cm$^{-3}$ or more and $1\times10^{21}$ cm$^{-3}$ or less. The depth of the source region 28 is smaller than the depth of the body region 26, and for example, the depth of the source region 28 is 0.1 µm or more and 0.3 µm or less.

The source region 28 is in contact with the source electrode 12. The contact between the source region 28 and the source electrode 12 is, for example, ohmic contact. The source region 28 is fixed to the potential of the source electrode 12.

The p$^-$-type first guard ring region 31 is provided between the drift region 24 and the first plane P1. The first guard ring region 31 surrounds the element region 101.

The first guard ring region 31 contains, for example, aluminum (Al) as a p-type impurity. The p-type impurity concentration of the first guard ring region 31 is lower than the p-type impurity concentration of the body region 26. The p-type impurity concentration of the first guard ring region 31 is, for example, $5\times10^{16}$ cm$^{-3}$ or more and $5\times10^{17}$ cm$^{-3}$ or less.

The p$^-$-type second guard ring region 32 is provided between the drift region 24 and the first plane P1. The second guard ring region 32 surrounds the first guard ring region 31.

The second guard ring region 32 contains, for example, aluminum (Al) as a p-type impurity. The p-type impurity concentration of the second guard ring region 32 is lower than the p-type impurity concentration of the body region 26. The p-type impurity concentration of the second guard ring region 32 is, for example, $5\times10^{16}$ cm$^{-3}$ or more and $5\times10^{17}$ cm$^{-3}$ or less.

The p$^-$-type third guard ring region 33 is provided between the drift region 24 and the first plane P1. The third guard ring region 33 surrounds the second guard ring region 32.

The third guard ring region 33 contains, for example, aluminum (Al) as a p-type impurity. The p-type impurity concentration of the third guard ring region 33 is lower than the p-type impurity concentration of the body region 26. The p-type impurity concentration of the third guard ring region 33 is, for example, $5\times10^{16}$ cm$^{-3}$ or more and $5\times10^{17}$ cm$^{-3}$ or less.

The first guard ring region 31, the second guard ring region 32, and the third guard ring region 33 have a function of relaxing the strength of the electric field applied to the end portion of the element region 101 in the state where the MOSFET 100 is turned off.

FIG. 2 illustrates the patterns of the first guard ring region 31, the second guard ring region 32, and the third guard ring region 33 on the first plane P1 of the silicon carbide layer 10.

The first guard ring region 31 has a dot-line shape configured with first dot portions 31a and first space portions 31b between the first dot portions 31a. In the first guard ring region 31, the occupation ratio of the first dot portions 31a of the corner portions 102c of the termination region 102 is larger than the occupation ratio of the first dot portions 31a of the first straight-line portions 102a and the second straight-line portions 102b. For example, the length of the first dot portions 31a of the corner portions 102c of the termination region 102 is larger than the length of the first dot portions 31a of the first straight-line portions 102a and the second straight-line portions 102b.

The second guard ring region 32 has a dot-line shape configured with second dot portions 32a and second space portions 32b between the second dot portions 32a. In the second guard ring region 32, the occupation ratio of the second dot portions 32a of the corner portions 102c of the termination region 102 is larger than the occupation ratio of the second dot portions 32a of the first straight-line portions 102a and the second straight-line portions 102b. For example, the length of the second dot portions 32a of the corner portions 102c of the termination region 102 is larger than the length of the second dot portions 32a of the first straight-line portions 102a and the second straight-line portions 102b.

The third guard ring region 33 has a dot-line shape configured with third dot portions 33a and third space portions 33b between the third dot portions 33a. In the third guard ring region 33, the occupation ratio of the third dot portions 33a of the corner portions 102c of the termination region 102 is larger than the occupation ratio of the third dot portions 33a of the first straight-line portions 102a and the second straight-line portions 102b. For example, the length of the third dot portions 33a of the corner portions 102c of the termination region 102 is larger than the length of the third dot portions 33a of the first straight-line portions 102a and the second straight-line portions 102b.

For example, the second dot portions 32a of the second guard ring region 32 are arranged so as to be located between the first space portions 31b of the first guard ring region 31 and the third space portions 33b of the third guard ring region 33.

For example, the occupation ratio of the first dot portions 31a of the first guard ring region 31 is larger than the occupation ratio of the third dot portions 33a of the third guard ring region 33. For example, in the first straight-line portions 102a and the second straight-line portions 102b, the occupation ratio of the first dot portions 31a of the first guard ring region 31 is larger than the occupation ratio of the third dot portions 33a of the third guard ring region 33.

The p$^{--}$-type resurf region 34 is provided between the drift region 24 and the first plane P1. The resurf region 34 surrounds the element region 101. The resurf region 34 is provided between the first guard ring region 31 and the second guard ring region 32.

The resurf region 34 contains, for example, aluminum (Al) as a p-type impurity. The p-type impurity concentration of the resurf region 34 is lower than the p-type impurity concentrations of the first guard ring region 31, the second guard ring region 32, and the third guard ring region 33. The p-type impurity concentration of the resurf region 34 is, for example, $1\times10^{16}$ cm$^{-3}$ or more and $5\times10^{16}$ cm$^{-3}$ or less.

The resurf region 34 has a function of relaxing the strength of the electric field applied to the field insulating layer 21 in the state where the MOSFET 100 is turned off.

The depth of the resurf region 34 is smaller than, for example, the depth of the body region 26. The depths of the first guard ring region 31, the second guard ring region 32, and the third guard ring region 33 are smaller than, for example, the depth of the resurf region 34.

The gate electrode 18 is provided on the side of the first plane P1 of the silicon carbide layer 10. The gate electrode 18 is a conductive layer. The gate electrode 18 is made of, for example, a polycrystalline silicon containing p-type impurities or n-type impurity.

The gate insulating layer 16 is provided between the gate electrode 18 and the body region 26. The gate insulating layer 16 is provided between the gate electrode 18 and the source region 28.

The gate insulating layer 16 is made of, for example, silicon oxide. For example, a high-k dielectric material (high-dielectric insulating material) can be applied to the gate insulating layer 16.

The interlayer insulating layer 20 is provided on the gate electrode 18 and on the silicon carbide layer 10. The interlayer insulating layer 20 is made of, for example, silicon oxide.

The field insulating layer 21 is provided on the silicon carbide layer 10 of the termination region 102. The field insulating layer 21 is provided on the first guard ring region 31, the second guard ring region 32, and the third guard ring region 33 and is provided on the resurf region 34. The field insulating layer 21 is made of, for example, silicon oxide.

The source electrode 12 contains a metal. The source electrode 12 has, for example, a stacked structure of titanium (Ti) and aluminum (Al).

The drain electrode 14 is provided on the back plane of the silicon carbide layer 10. The drain electrode 14 is in contact with the drain region 22.

The drain electrode 14 is made of, for example, a metal or a metal semiconductor compound. The drain electrode 14 contains, for example, at least one material selected from a group consisting of nickel silicide, titanium (Ti), nickel (Ni), silver (Ag), and gold (Au).

Next, functions and effects of the MOSFET 100 of the first embodiment will be described.

Figure 4:
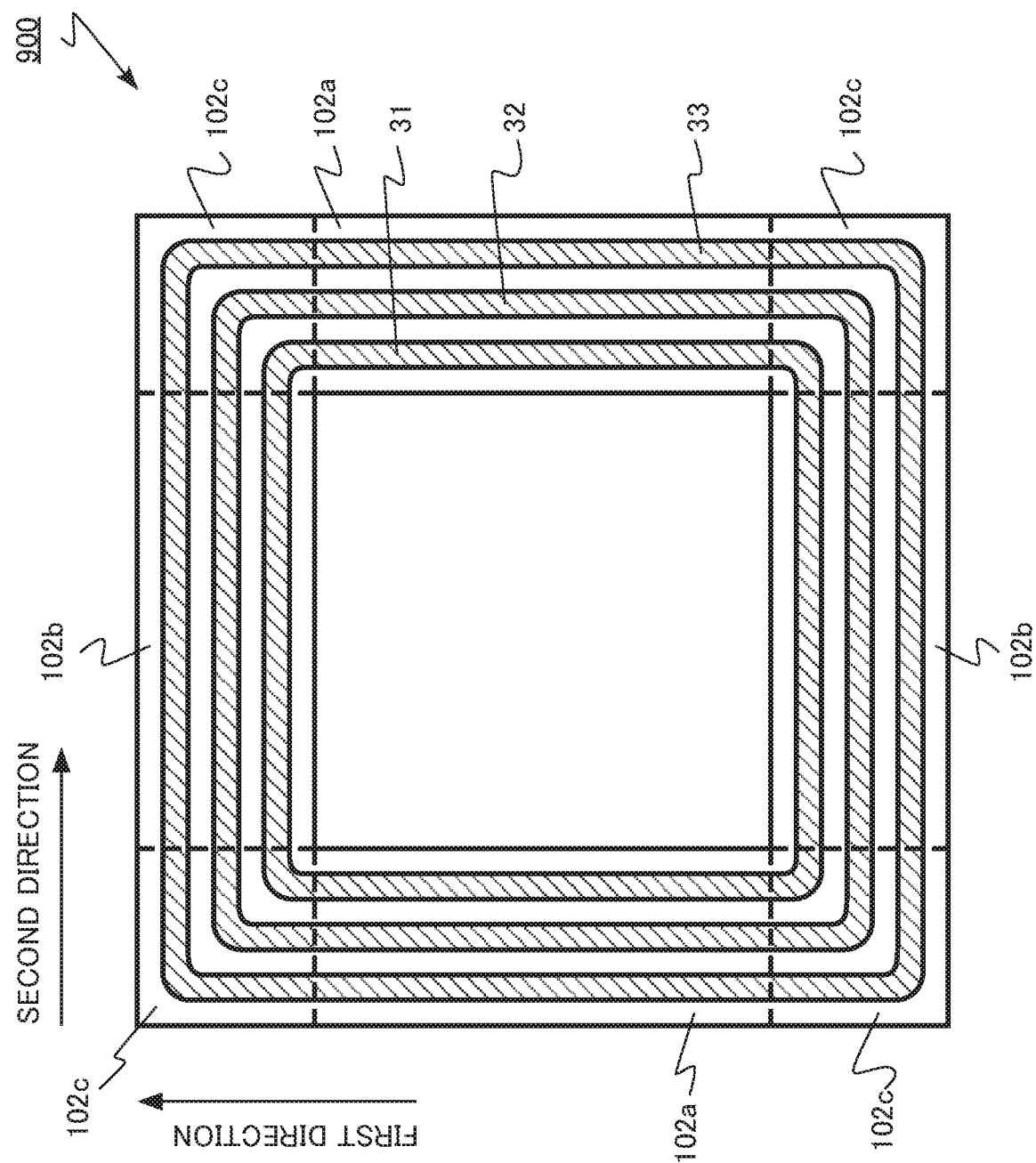
FIG. 4 is a schematic top view of a semiconductor device of Comparative Example.

FIG. 4 is a schematic top view of a semiconductor device of Comparative Example. The semiconductor device of Comparative Example is a MOSFET 900. FIG. 4 illustrates patterns of the first guard ring region 31, the second guard ring region 32, and the third guard ring region 33 of the MOSFET 900 on the first plane P1 of the silicon carbide layer 10.

The MOSFET 900 is different from the MOSFET 100 of the first embodiment in that the first guard ring region 31, the second guard ring region 32, and the third guard ring region 33 have a line shape having a substantially constant width.

In some cases, if the operation of the MOSFET 900 continues to be performed, the breakdown voltage of the MOSFET 900 is varied, and thus reliability failure occurs. One factor of the variation in breakdown voltage is considered that the external charges or the injected charges are trapped into the oxide film of the termination region, and thus, the electric field distribution in the termination region is changed. In particular, the corner portions of the termination region become singular points of the shape of the impurity regions, and thus, the electric field is easily concentrated, so that the trapping of the external charges and the injected charges into the oxide film is considered to easily occur.

In the MOSFET 100 of the first embodiment, the first guard ring region 31 has a dot-line shape configured with the first dot portions 31a and the first space portions 31b between the first dot portions 31a. The occupation ratio of the first dot portions 31a of the corner portions 102c of the termination region 102 is larger than the occupation ratio of the first dot portions 31a of the first straight-line portions 102a and the second straight-line portions 102b. The same configuration as that of the first guard ring region 31 is also applied to the second guard ring region 32 and the third guard ring region 33.

With the above configuration, it is possible to allow the p-type impurity amount of the corner portions 102c of the termination region 102 to be larger than the p-type impurity amount of the first straight-line portions 102a and the second straight-line portions 102b. For example, the p-type impurity amount per unit area of the corner portions 102c is larger than that of the first straight-line portions 102a and the second straight-line portions 102b. Thus, even though the external charges or the injected charges are trapped in the field insulating layer 21 of the termination region 102 during the operation of the MOSFET 100, the influence of the charges is suppressed. In other words, in the corner portions 102c, the margin of the variation in breakdown voltage on the external charges and the injection charges is improved. Therefore, the variation in breakdown voltage of the MOSFET 100 is suppressed, so that it is possible to improve the reliability.

From the viewpoint of improving the breakdown voltage of the MOSFET 100, it is preferable that the guard ring is arranged so that the second dot portions 32a of the second guard ring region 32 are located between the first space portions 31b of the first guard ring region 31 and the third space portions 33b of the third guard ring region 33. It is suppressed that the electric field is concentrated on the space portions.

From the viewpoint of improving the breakdown voltage of the MOSFET 100, it is preferable that the occupation ratio of the first dot portions 31a of the first guard ring region 31 is larger than the occupation ratio of the third dot portions 33a of the third guard ring region 33. For example, it is preferable that, in the first straight-line portions 102a and the second straight-line portions 102b, the occupation ratio of the first dot portions 31a of the first guard ring region 31 is larger than the occupation ratio of the third dot portions 33a of the third guard ring region 33. As the p-type impurity amount increases in a direction from the outside toward the inside of the termination region 102, the breakdown voltage of the MOSFET 100 is improved.

From the viewpoint of improving the breakdown voltage of the MOSFET 100, it is preferable that the depths of the first guard ring region 31, the second guard ring region 32, and the third guard ring region 33 are smaller than the depth of the resurf region 34.

As described above, according to the first embodiment, the margin of the variation in breakdown voltage on the external charges and injected charges is improved, so that it is possible to implement the MOSFET capable of improving the reliability.

Second Embodiment

A semiconductor device of a second embodiment includes: a silicon carbide layer having a first plane and a second plane, the silicon carbide layer including an element region and a termination region surrounding the element region, the termination region having first straight-line portions extending in a first direction, second straight-line portions extending in a second direction intersecting the first direction, and corner portions between the first straight-line portions and the second straight-line portions, the termination region including a first silicon carbide region of first-conductivity-type, a second silicon carbide region of second-conductivity-type provided between the first silicon carbide region and the first plane, the second silicon carbide region having a line shape surrounding the element region, a line width of the corner portions being larger than a line width of the first straight-line portions, a third silicon carbide region of second-conductivity-type provided between the first silicon carbide region and the first plane, the third silicon carbide region having a line shape surrounding the second silicon carbide region, a line width of the corner portions being larger than a line width of the first straight-line portions, and a fourth silicon carbide region of second-conductivity-type provided between the first silicon carbide region and the first plane, the fourth silicon carbide region having a line shape surrounding the third silicon carbide region, a line width of the corner portions being larger than a line width of the first straight-line portions; a first electrode provided on a side of the first plane of the silicon carbide layer; and a second electrode provided on a side of the second plane of the silicon carbide layer.

The semiconductor device of the second embodiment is different from the semiconductor device of the first embodiment in that the second silicon carbide region, the third silicon carbide region, and the fourth silicon carbide region have a line shape, and the line width of the corner portions is larger than the line width of the first straight-line portions. Hereinafter, a portion of the contents overlapped with the first embodiment will be omitted in description.

Figure 5:
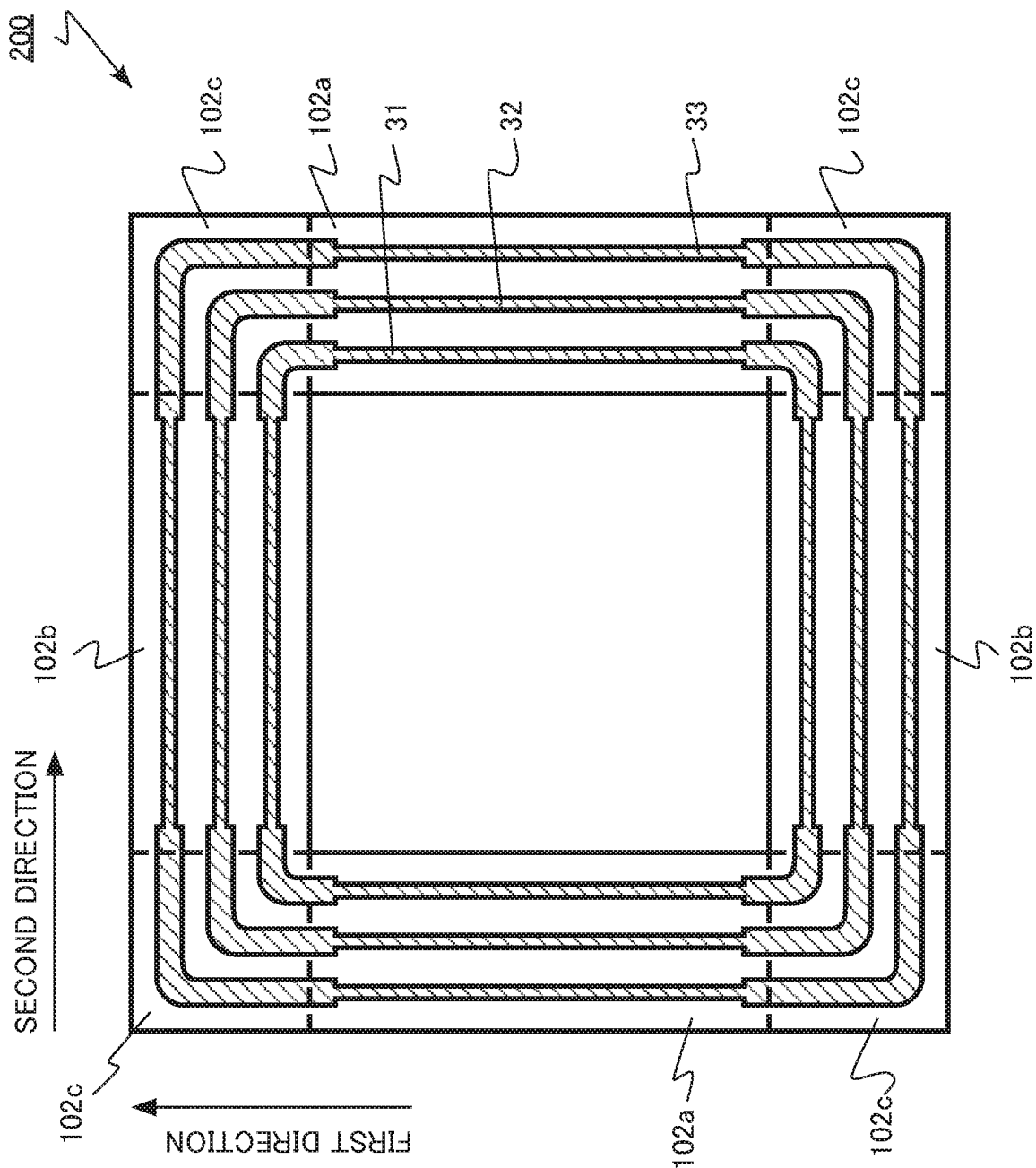
FIG. 5 is a schematic top view of a semiconductor device of a second embodiment.

FIG. 5 is a schematic top view of the semiconductor device of the second embodiment. The semiconductor device of the second embodiment is a vertical planar gate type MOSFET 200 using silicon carbide.

FIG. 5 illustrates the patterns of the first guard ring region 31, second guard ring region 32, and the third guard ring region 33 on the first plane P1 of the silicon carbide layer 10.

The first guard ring region 31 has a line shape surrounding the element region 101. The line width of the corner portions 102c of the first guard ring region 31 is larger than the line width of the first straight-line portions 102a. In addition, the line width of the corner portions 102c of the first guard ring region 31 is larger than the line width of the second straight-line portions 102b. The line width of the corner portions 102c is, for example, 1.2 times or more the line width of the first straight-line portions 102a. The line width of the corner portions 102c is, for example, 1.2 times or more the line width of the second straight-line portions 102b.

The second guard ring region 32 has a line shape surrounding the first guard ring region 31. The line width of the corner portions 102c of the second guard ring region 32 is larger than the line width of the first straight-line portions 102a. In addition, the line width of the corner portions 102c of the second guard ring region 32 is larger than the line width of the second straight-line portions 102b. The line width of the corner portions 102c is, for example, 1.2 times or more the line width of the first straight-line portions 102a. The line width of the corner portions 102c is, for example, 1.2 times or more the line width of the second straight-line portions 102b.

The third guard ring region 33 has a line shape surrounding the second guard ring region 32. The line width of the corner portions 102c of the third guard ring region 33 is larger than the line width of the first straight-line portions 102a. In addition, the line width of the corner portions 102c of the third guard ring region 33 is larger than the line width of the second straight-line portions 102b. The line width of the corner portions 102c is, for example, 1.2 times or more the line width of the first straight-line portions 102a. The line width of the corner portions 102c is, for example, 1.2 times or more the line width of the second straight-line portions 102b.

In addition, the line widths of the first guard ring region 31, second guard ring region 32, and the third guard ring region 33 are defined as widths in directions perpendicular to the extension directions of the respective regions.

According to MOSFET 200 of the second embodiment, since the line width of the corner portions 102c is set to be larger than the line width of the first straight-line portions 102a and the line width of the second straight-line portions 102b, it is possible to allow the p-type impurity amount of the corner portions 102c of the termination region 102 to be larger than the p-type impurity amount of the first straight-line portions 102a and the second straight-line portions 102b of the termination region 102. Therefore, the variation in breakdown voltage of the MOSFET 200 is suppressed, so that it is possible to improve the reliability.

From the viewpoint of increasing the p-type impurity amount of the corner portions 102c of the termination region 102, it is preferable that the line width of the corner portions 102c is 1.2 times or more the line width of the first straight-line portions 102a, and it is more preferable that the line width of the corner portions 102c is 1.5 times or more the line width of the first straight-line portions 102a. In addition, it is preferable that the line width of the corner portions 102c is 1.2 times or more the line width of the second straight-line portions 102b, and it is more preferable that the line width of the corner portions 102c is 1.5 times or more the line width of the second straight-line portions 102b.

As described above, according to the second embodiment, the margin of the variation in breakdown voltage on the external charges and injected charges is improved, so that it is possible to implement the MOSFET capable of improving the reliability.

Third Embodiment

A semiconductor device of a third embodiment includes: a silicon carbide layer having a first plane and a second plane, the silicon carbide layer including an element region and a termination region surrounding the element region, the termination region having first straight-line portions extending in a first direction, second straight-line portions extending in a second direction intersecting the first direction, and corner portions between the first straight-line portions and the second straight-line portions, the termination region including a first silicon carbide region of first-conductivity-type, a second silicon carbide region of second-conductivity-type provided between the first silicon carbide region and the first plane, the second silicon carbide region having a line shape surrounding the element region, a third silicon carbide region of second-conductivity-type provided between the first silicon carbide region and the first plane, the third silicon carbide region having a line shape surrounding the second silicon carbide region, and a fourth silicon carbide region of second-conductivity-type provided between the first silicon carbide region and the first plane, the fourth silicon carbide region being provided between the second silicon carbide region and the third silicon carbide region of the corner portions, and not being provided in at least a portion between the second silicon carbide region and the third silicon carbide region of the first straight-line portions; a first electrode provided on a side of the first plane of the silicon carbide layer; and a second electrode provided on a side of the second plane of the silicon carbide layer.

The semiconductor device of the third embodiment is different from the semiconductor device of the first embodiment in that the second silicon carbide region and the third silicon carbide region has a line shape, the fourth silicon carbide region is interposed between the second silicon carbide region and the third silicon carbide region, and the fourth silicon carbide region is not provided in at least a portion between the second silicon carbide region and the third silicon carbide region of the first straight-line portions. Hereinafter, a portion of the contents overlapped with the first embodiment will be omitted in description.

Figure 6:
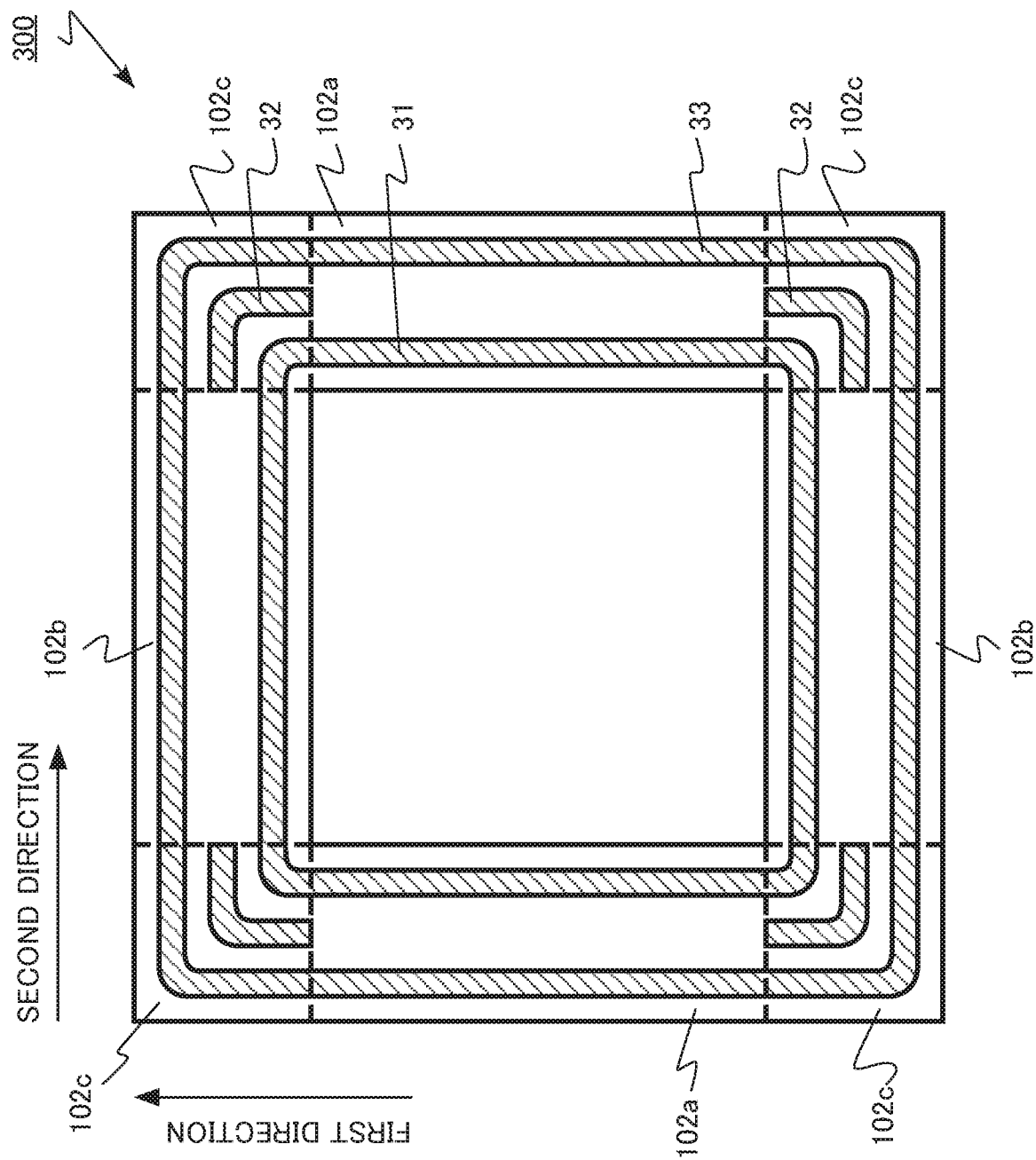
FIG. 6 is a schematic top view of a semiconductor device of a third embodiment.

FIG. 6 is a schematic top view of a semiconductor device of the third embodiment. The semiconductor device of the third embodiment is a vertical planar gate type MOSFET 300 using silicon carbide.

FIG. 6 illustrates the patterns of the first guard ring region 31 (second silicon carbide region), the second guard ring region 32 (fourth silicon carbide region), and the third guard ring region 33 (third carbide silicon region) on the first plane P1 of the silicon carbide layer 10.

The first guard ring region 31 has a line shape surrounding the element region 101. The third guard ring region 33 has a line shape surrounding the first guard ring region 31.

The second guard ring region 32 is provided between the first guard ring region 31 and the third guard ring region 33. The second guard ring region 32 is provided between the first guard ring region 31 and the third guard ring region 33 of the corner portions 102c. The second guard ring region 32 is not provided on at least a portion between the first guard ring region 31 and the third guard ring region 33 of the first straight-line portions 102a. In addition, the second guard ring region 32 is not provided on at least a portion between the first guard ring region 31 and the third guard ring region 33 of the second straight-line portions 102b.

The second guard ring region 32 is divided by the first straight-line portions 102a and the second straight-line portions 102b. In other words, in the MOSFET 300, the guard ring has been thinned out by the first straight-line portions 102a and the second straight-line portions 102b.

According to the MOSFET 300 of the third embodiment, since the second guard ring region 32 is not provided to the first straight-line portions 102a and the second straight-line portions 102b, it is possible to allow the p-type impurity amount of the corner portions 102c of the termination region 102 to be larger than the p-type impurity amount of the first straight-line portions 102a and the second straight-line portions 102b of the termination region 102. Therefore, the variation in breakdown voltage of the MOSFET 300 is suppressed, so that it is possible to improve the reliability.

As described above, according to the third embodiment, the margin of the variation in breakdown voltage on the external charges and injected charges is improved, so that it is possible to implement the MOSFET capable of improving the reliability.

In the first to third embodiments, the case of using 4H-SiC as a crystal structure of the SiC has been described as an example, but embodiments may also be applied to devices using other SiC crystal structures such as 6H-SiC and 3C-SiC. In addition, a plane other than the (0001) plane may also be applied to the front plane of the silicon carbide layer 10.

In the first to third embodiments, the vertical planar gate type MOSFETs have been described as examples, embodiments may also be applied, for example, a vertical trench gate type MOSFET. In addition, embodiments may also be applied to devices other than the MOSFET, for example, a Schottky barrier diode (SBD) or the like.

In the first to third embodiments, a case where there are three guard ring regions has been described as an example, but the number of guard ring regions may also be two or less or may also be four or more.

In the first to third embodiments, a case where the first conductivity type is n-type and the second conductivity type is p-type has been described as an example, but the first conductivity type may also be p-type, and the second conductivity type may also be n-type.

In the first to third embodiments, aluminum (Al) has been exemplified as a p-type impurity, but boron (B) may also be used. In addition, nitrogen (N) and phosphorus (P) have been exemplified as an n-type impurity, but arsenic (As), antimony (Sb), or the like may also be used.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer having a first plane and a second plane,
the silicon carbide layer including
an element region and
a termination region surrounding the element region, the termination region having first straight-line portions extending in a first direction, second straight-line portions extending in a second direction intersecting the first direction, and corner portions between the first straight-line portions and the second straight-line portions,
the termination region including
a first silicon carbide region of first-conductivity-type,
a second silicon carbide region of second-conductivity-type provided between the first silicon carbide region and the first plane, the second silicon carbide region surrounding the element region, the second silicon carbide region having a dot-line shape configured with first dot portions and first space portions between the first dot portions, an occupation ratio of the first dot portions of the corner portions being larger than an occupation ratio of the first dot portions of the first straight-line portions,
a third silicon carbide region of second-conductivity-type provided between the first silicon carbide region and the first plane, the third silicon carbide region surrounding the second silicon carbide region, the third silicon carbide region having a dot-line shape configured with second dot portions and second space portions between the second dot portions, an occupation ratio of the second dot portions of the corner portions being larger than an occupation ratio of the second dot portions of the first straight-line portions, and
a fourth silicon carbide region of second-conductivity-type provided between the first silicon carbide region and the first plane, the fourth silicon carbide region surrounding the third silicon carbide region, the fourth silicon carbide region having a dot-line shape configured with third dot portions and third space portions between the third dot portions, an occupation ratio of the third dot portions of the corner portions being larger than an occupation ratio of the third dot portions of the first straight-line portions;
a first electrode provided on a side of the first plane of the silicon carbide layer; and
a second electrode provided on a side of the second plane of the silicon carbide layer.

2. The semiconductor device according to claim 1, wherein the second dot portions are located between the first space portions and the third space portions.

3. The semiconductor device according to claim 1, wherein the occupation ratio of the first dot portions of the second silicon carbide region is larger than the occupation ratio of the third dot portions of the fourth silicon carbide region.

4. The semiconductor device according to claim 1, wherein the termination region includes a fifth silicon carbide region of second-conductivity-type provided between the second silicon carbide region and the third silicon carbide region, the fifth silicon carbide region has a second-conductivity-type impurity concentration lower than that of the second silicon carbide region.

5. The semiconductor device according to claim 4, wherein the fifth silicon carbide region is electrically connected to the first electrode.

6. The semiconductor device according to claim 4, wherein a depth of the second silicon carbide region is smaller than a depth of the fifth silicon carbide region.

7. The semiconductor device according to claim 1, wherein a second-conductivity-type impurity concentration of the second silicon carbide region is $5\times10^{16}$ cm$^{-3}$ or more and $5\times10^{17}$ cm$^{-3}$ or less.

8. A semiconductor device comprising:
a silicon carbide layer having a first plane and a second plane,
the silicon carbide layer including
an element region and
a termination region surrounding the element region,
the termination region having first straight-line portions extending in a first direction, second straight-line portions extending in a second direction intersecting the first direction, and corner portions between the first straight-line portions and the second straight-line portions,
the termination region including
a first silicon carbide region of first-conductivity-type,
a second silicon carbide region of second-conductivity-type provided between the first silicon carbide region and the first plane, the second silicon carbide region having a line shape surrounding the element region, a line width of the corner portions being larger than a line width of the first straight-line portions,
a third silicon carbide region of second-conductivity-type provided between the first silicon carbide region and the first plane, the third silicon carbide region having a line shape surrounding the second silicon carbide region, a line width of the corner portions being larger than a line width of the first straight-line portions, and
a fourth silicon carbide region of second-conductivity-type provided between the first silicon carbide region and the first plane, the fourth silicon carbide region having a line shape surrounding the third silicon carbide region, a line width of the corner portions being larger than a line width of the first straight-line portions;
a first electrode provided on a side of the first plane of the silicon carbide layer; and
a second electrode provided on a side of the second plane of the silicon carbide layer.

9. The semiconductor device according to claim 8, wherein the line width of the second silicon carbide region of the corner portions is 1.2 times or more the line width of the second silicon carbide region of the first straight-line portions.

10. The semiconductor device according to claim 8, wherein the termination region includes a fifth silicon carbide region of second-conductivity-type provided between the second silicon carbide region and the third silicon carbide region, the fifth silicon carbide region has a second-conductivity-type impurity concentration lower than that of the second silicon carbide region.

11. The semiconductor device according to claim 10, wherein the fifth silicon carbide region is electrically connected to the first electrode.

12. The semiconductor device according to claim 10, wherein a depth of the second silicon carbide region is smaller than a depth of the fifth silicon carbide region.

13. The semiconductor device according to claim 8, wherein a second-conductivity-type impurity concentration of the second silicon carbide region is $5\times10^{16}$ cm$^{-3}$ or more and $5\times10^{17}$ cm$^{-3}$ or less.

14. A semiconductor device comprising:
a silicon carbide layer having a first plane and a second plane,
the silicon carbide layer including
an element region and
a termination region surrounding the element region,
the termination region having first straight-line portions extending in a first direction, second straight-line portions extending in a second direction intersecting the first direction, and corner portions between the first straight-line portions and the second straight-line portions,
the termination region including
a first silicon carbide region of first-conductivity-type,
a second silicon carbide region of second-conductivity-type provided between the first silicon carbide region and the first plane, the second silicon carbide region having a line shape surrounding the element region,
a third silicon carbide region of second-conductivity-type provided between the first silicon carbide region and the first plane, the third silicon carbide region having a line shape surrounding the second silicon carbide region, and
a fourth silicon carbide region of second-conductivity-type provided between the first silicon carbide region and the first plane, the fourth silicon carbide region being provided between the second silicon carbide region and the third silicon carbide region of the corner portions, and not being provided in at least a portion between the second silicon carbide region and the third silicon carbide region of the first straight-line portions;
a first electrode provided on a side of the first plane of the silicon carbide layer; and
a second electrode provided on a side of the second plane of the silicon carbide layer.

15. The semiconductor device according to claim 14, wherein the termination region includes a fifth silicon carbide region of second-conductivity-type provided between the second silicon carbide region and the third silicon carbide region, the fifth silicon carbide region has a second-conductivity-type impurity concentration lower than that of the second silicon carbide region.

16. The semiconductor device according to claim 14, wherein the fifth silicon carbide region is electrically connected to the first electrode.

17. The semiconductor device according to claim 16, wherein a depth of the second silicon carbide region is smaller than a depth of the fifth silicon carbide region.

18. The semiconductor device according to claim 14, wherein a second-conductivity-type impurity concentration of the second silicon carbide region is $5\times10^{16}$ cm$^{-3}$ or more and $5\times10^{17}$ cm$^{-3}$ or less.

* * * * *